United States Patent
Cooper

(10) Patent No.: US 6,169,499 B1
(45) Date of Patent: Jan. 2, 2001

(54) LZW DATA COMPRESSION/ DECOMPRESSION APPARATUS AND METHOD WITH EMBEDDED RUN-LENGTH ENCODING/DECODING

(75) Inventor: Albert B. Cooper, New York, NY (US)

(73) Assignee: Unisys Corporation, Blue Bell, PA (US)

(*) Notice: Under 35 U.S.C. 154(b), the term of this patent shall be extended for 0 days.

(21) Appl. No.: 09/336,219

(22) Filed: Jun. 19, 1999

(51) Int. Cl.[7] .................................................. H03M 7/34
(52) U.S. Cl. ................................................. 341/51; 341/63
(58) Field of Search .................................. 341/50, 51, 63, 341/65, 67

(56) References Cited

U.S. PATENT DOCUMENTS

| | | | |
|---|---|---|---|
| 4,558,302 | 12/1985 | Welch | 340/347 |
| 4,929,946 | 5/1990 | O'Brien et al. | 341/87 |
| 4,971,407 | 11/1990 | Hoffman | 341/87 |
| 4,988,998 | 1/1991 | O'Brien | 341/55 |
| 5,247,638 | 9/1993 | O'Brien et al. | 395/425 |
| 5,389,922 | 2/1995 | Seroussi et al. | 341/51 |
| 5,764,167 | * 9/1998 | Adams et al. | 341/63 |
| 5,861,827 | 1/1999 | Welch et al. | 341/51 |

OTHER PUBLICATIONS

Internet site: *http://www.boutell.com/gd*. pp. 1–2.

* cited by examiner

*Primary Examiner*—Peguy JeanPierre
(74) *Attorney, Agent, or Firm*—Albert B. Cooper; Mark T. Starr; Rocco L. Adornato

(57) ABSTRACT

In an LZW data compressor, the occurrence of a character run in the input character stream is determined and the run count is added to the existing code in the compressor code counter to generate a compressor code output representative of the run count. The LZW data decompressor subtracts the existing code in the decompressor code counter from the received compressed code to recover the run count. In accordance with a further feature, large length runs are processed by reducing the run count to less than the system maximum code by subtracting a selected predetermined constant from the run count. The reduced run count is outputted by the compressor preceded by a reserved code representative of the selected predetermined constant. In response to the received reserved code and the reduced count that follows, the decompressor adds the selected predetermined constant corresponding to the received reserved code to the received reduced count to recover the original run count.

52 Claims, 8 Drawing Sheets

| COUNT | DECIMAL VALUE OF UPPER LIMIT | REDUCED COUNT | RESERVED CODE |
|---|---|---|---|
| COUNT < $2^{12}$ | 4096 | ----- | 257 |
| $2^{12}$ ≤ COUNT < $2 \times 2^{12}$ | 8192 | COUNT - $2^{12}$ | 258 |
| $2 \times 2^{12}$ ≤ COUNT < $3 \times 2^{12}$ | 12288 | COUNT - $2 \times 2^{12}$ | 259 |
| $3 \times 2^{12}$ ≤ COUNT < $4 \times 2^{12}$ | 16384 | COUNT - $3 \times 2^{12}$ | 260 |
| $4 \times 2^{12}$ ≤ COUNT < $5 \times 2^{12}$ | 20480 | COUNT - $4 \times 2^{12}$ | 261 |
| LIMIT = $5 \times 2^{12}$ = 20480 CHARACTERS | | | |

*Figure 2*

| RESERVED CODE | INCREASED COUNT |
|---|---|
| 257 | ----- |
| 258 | COUNT + $2^{12}$ |
| 259 | COUNT + $2 \times 2^{12}$ |
| 260 | COUNT + $3 \times 2^{12}$ |
| 261 | COUNT + $4 \times 2^{12}$ |

*Figure 6*

RUN PROCESSING

RUN PROCESSING

INPUT DATA CHARACTER STREAM $a_1\ b_1\ a_2\ b_2\ a_3\ b_3\ a_4\ a_5\ a_6\ \ldots\ a_{50}\ c_1\ c_2\ \ldots\ c_{15000}\ d\ e\ x$

| ACT-IONS | CURR MATCH | CURRENT CHARACT | CODE CNTR | DICT | | OUT-PUT | CHARACT TEMP | RESVD CODE | COUNT | BLOCKS OF FIGS. 3 & 4 |
|---|---|---|---|---|---|---|---|---|---|---|
| | | | | CODE | CHAR | | | | | |
| 1 | $a_1$ | $b_1$ | 262 | $a_1$ | $b_1$ | | | | | 60–64,66 |
| 2 | $b_1$ | $a_2$ | 263 | $b_1$ | $a_2$ | $a_1$ | | | | 69,70,74,76,77,64,66 |
| 3 | $a_2$ | $b_2$ | 264 | | | $b_1$ | | | | 69,70,74,76,77 |
| 4 | 262 | $a_3$ | | 262 | $a_3$ | | | | | 64,65,63,66 |
| 5 | $a_3$ | $b_3$ | 265 | | | 262 | | | | 69,70,74,76,77 |
| 6 | 262 | $a_4$ | | | | | | | | 64,65,63 |
| 7 | 264 | $a_5$ | | 264 | $a_5$ | | | | | 64,65,63,66 |
| 8 | | | 266 | | | 264 | | | | 69,70,74,75 |
| 9 | | $a_6$ | | | | $a_5$ | $a_5$ | | 0 | 80–85 |
| 10 | | $a_7$ | | | | | $a_6$ | | 1 | 86,82–85 |
| | | ... | | | | | ... | | .. | 86,82–85 |
| 11 | | $a_{50}$ | | | | | $a_{49}$ | | 44 | 86,82–85 |
| 12 | | $c_1$ | | | | | $a_{50}$ | | 45 | 86,82–84,90 |
| 13 | $c_1$ | $c_2$ | | $c_1$ | $c_2$ | 311 | | | 311 | 91,92,76,77,64,66 |
| 14 | | | 267 | | | $c_1$ | | | | 69,70,74,75 |
| 15 | | $c_3$ | | | | $c_2$ | $c_2$ | | 0 | 80–85 |
| 16 | | $c_4$ | | | | | $c_3$ | | 1 | 86,82–85 |
| | | ... | | | | | ... | | .. | 86,82–85 |
| 17 | | $c_{15000}$ | | | | | $c_{14999}$ | | 14997 | 86,82–85 |
| 18 | | d | | | | | $c_{15000}$ | | 14998 | 86,82–84,90,93 |
| 19 | | | | | | 260 | | 260 | 2710 | 97,98,95 |
| 20 | d | e | | d | e | 2710 | | | | 96,76,77,64,66 |
| 21 | e | x | 268 | e | x | d | | | | 69,70,74,76,77,64,66 |
| 22 | x | | 269 | | | e | | | | 69,70,74,76 |

*Figure 9*

INPUT COMPRESSED CODE STREAM $a_1$ $b_1$ 262 264 $a_5$ 311 $c_1$ $c_2$ 260 2710 d e

| ACTIONS | PREVIOUS CODE | CURRENT CODE | CODE COUNTER | DICTIONARY | | COUNT | OUTPUT | BLOCKS OF FIGS. 7 & 8 |
|---|---|---|---|---|---|---|---|---|
| | | | | CODE | CHAR | | | |
| 1 | $a_1$ | $a_1$ | 262 | | | | $a_1$ | 160-164 |
| 2 | | $b_1$ | | $a_1$ | $b_1$ | | $b_1$ | 165,169,180,181 |
| 3 | $b_1$ | 262 | 263 | $b_1$ | $a_1$ | | $a_1 b_1$ | 184,185,165, 169,180,181 |
| 4 | 262 | 264 | 264 | 262 | $a_1$ | | $a_1 b_1 a_1$ | 184,185,165, 190,191 |
| 5 | 264 | $a_5$ | 265 | 264 | $a_5$ | | $a_5$ | 184,185,165, 169,180,181 |
| 6 | $a_5$ | 311 | 266 | | | 45 | $a_6$-$a_{50}$ | 184,185,165, 167,200,201 |
| 7 | $c_1$ | $c_1$ | | | | | $c_1$ | 162-164 |
| 8 | | $c_2$ | | $c_1$ | $c_2$ | | $c_2$ | 165,169,180,181 |
| 9 | $c_2$ | 260 | 267 | | | 2710 | | 184,185,165, 166,202,203 |
| 10 | | | | | | 14998 | $c_3$-$c_{15000}$ | 204,201 |
| 11 | d | d | | | | | d | 162-164 |
| 12 | | e | | d | e | | e | 165,169,180,181 |
| 13 | e | | 268 | | | | | 184,185 |

*Figure 10*

LZW DATA COMPRESSION/ DECOMPRESSION APPARATUS AND METHOD WITH EMBEDDED RUN-LENGTH ENCODING/DECODING

CROSS REFERENCE TO RELATED APPLICATIONS

U.S. patent application Ser. No. 09/264,269 by Cooper, filed Mar. 8, 1999, entitled "Data Compression Method And Apparatus With Embedded Run-Length Encoding".

U.S. patent application Ser. No. 09/300,810 by Cooper, filed Apr. 27, 1999, entitled "Data Compression Method And Apparatus With Embedded Run-Length Encoding Using Mathematical Run Processing".

Said patent applications Ser. No. 09/264,269 and Ser. No. 09/300,810 are incorporated herein by reference.

BACKGROUND OF THE INVENTION

1. Field of the Invention

The invention relates to LZW data compression and decompression systems particularly with respect to including run-length encoding and decoding within the LZW compression and decompression processing, respectively.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF and TIFF image communication protocols.

Another type of data compression and decompression, denoted as run-length encoding (RLE), compresses a repeating character run by providing a compressed code indicating the character and the length of the run. RLE is thus effective in encoding long strings of the same character. For example, RLE is effective in compressing a long sequence of blanks that may be included at the beginning of a data file. RLE is also effective in image compression where an image contains a long run of consecutive pixels having the same value, such as in the sky portion of a land-sky image.

In the prior art, run-length encoding has been combined with LZ systems as exemplified in the following U.S. Pat. No. 4,929,946 by O'Brien et al., issued May 29, 1990; U.S. Pat. No. 4,971,407 by Hoffman, issued Nov. 20, 1990; U.S. Pat. No. 4,988,998 by O'Brien, issued Jan. 29, 1991; U.S. Pat. No. 5,247,638 by O'Brien et al., issued Sep. 21, 1993; U.S. Pat. No. 5,389,922 by Seroussi et al., issued Feb. 14, 1995; and U.S. Pat. No. 5,861,827 by Welch et al., issued Jan. 19, 1999.

In some prior art systems, run-length encoding has been combined with an LZ system by applying the data to a run-length encoder and then applying the run-length encoded data to the LZ based system. In such an architecture, a run-length encoder is utilized at the front end of the compressor and a run-length decoder is utilized at the output end of the decompressor. Such a system suffers from the disadvantages of increased equipment, expense, control overhead and processing time. U.S. Pat. Nos. 4,971,407 and 4,988,998 exemplify such a system.

In the LZW based system of U.S. Pat. No. 5,389,922, certain output codes from the compressor are suppressed in the presence of a run of repeating input data characters. A special run enhancement engine is utilized at the input to the decompressor to regenerate the missing codes.

In the compressor of the system of U.S. Pat. No. 5,861, 827, when a partial string W and a character C are found, a new string is stored with C as an extension character on the string PW where P was the string conveyed in the last transmitted output compressed code. With this compression algorithm, a run of characters is encoded in two compressed codes regardless of its length. The decompressor of this system uses a special unrecognized code process to maintain synchronism with the compressor.

In the system of U.S. Pat. No. 4,929,946 a run is indicated by transmitting one of a predetermined set of reserved reference values followed by a repeat count for the run. The reserved reference values are defined so that the number of bits in the repeat count that follows the reserved reference value is reduced. The requirement of the use of the reserved reference value in the compressed stream for every run that is detected tends to reduce the compression. Additionally, the system is apparently limited to processing relatively small length runs. U.S. Pat. No. 5,247,638 provides descriptions similar to those of U.S. Pat. No. 4,929,946.

Another data compression system involving the encoding of data character runs is disclosed in said patent application Ser. No. 09/264,269. In the compressor of this patent application, runs are processed by successively looking ahead into the input to determine if contiguous numerically increasing segments exist in the run.

Yet another data compression system involving the encoding of data character runs is disclosed in said patent application Ser. No. 09/300,810. In the compressor of this patent application, runs are processed by mathematically determining, from the length of the run, the respective output codes corresponding to the contiguous numerically increasing segments that exist in the run.

It is an object of the present invention to embed run-length encoding and decoding in an LZW data compression and decompression system where a provision is included that does not require the transmission of a special reserved code to inform the decompressor of the existence of the run. It is a further object of the present invention to provide for the processing of very large length runs.

SUMMARY OF THE INVENTION

The present invention enhances the well-known LZW data compression/decompression system by determining when a run of input data characters occurs and by combining the run character count with the existing code value from the compressor code counter to generate a compressor output representative of the run count. The decompressor utilizes the existing code value in the decompressor code counter to recover the run count from the compressor output. In a further feature of the present invention, very large length runs are processed by reducing the run count by a selected predetermined process and outputting the reduced run count preceded by a reserved code representative of the selected predetermined process. In response to the received reserved code, the decompressor applies the predetermined process corresponding to the received reserved code to recover the original run count by increasing the received reduced count in accordance with the predetermined process.

BRIEF DESCRIPTION OF THE DRAWINGS

FIG. 2 is a chart providing details of the Count Reduction Table of FIG. 1.

FIG. 6 is a chart providing details of the Count Increase Table of FIG. 5.

FIG. 9 is a chart exemplifying the operations of the compressor of FIG. 1 in accordance with the control flow charts of FIGS. 3 and 4.

FIG. 10 is a chart exemplifying the operations of the decompressor of FIG. 5 in accordance with the control flow charts of FIGS. 7 and 8.

DESCRIPTION OF THE PREFERRED EMBODIMENT

Figure 1:
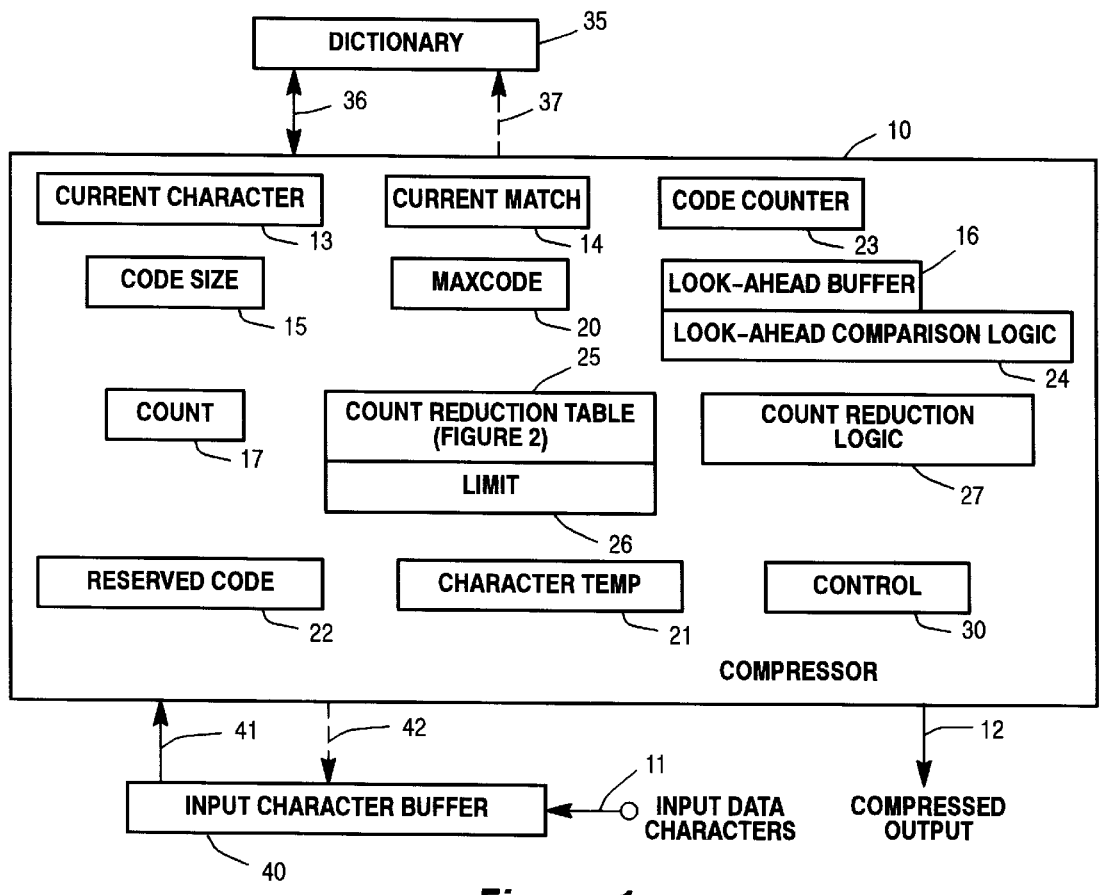
FIG. 1 is a schematic block diagram of a data compressor for compressing data in accordance with the present invention.

Referring to FIG. 1, a data compressor 10 is illustrated that compresses a stream of input data characters applied at an input 11 into a stream of corresponding compressed codes at an output 12. The compressor 10 includes working registers denoted as a Current Character register 13, a Current Match register 14, a Code Size register 15, a Look-Ahead Buffer 16, a Count register 17, a Maxcode register 20, a Character Temp register 21 and a Reserved Code register 22. The compressor 10 further includes a Code Counter 23 for sequentially generating code values that are used to process run and non-run characters in accordance with the present invention in a manner to be described.

The compressor 10 further includes look-ahead comparison logic 24 that performs comparisons between a character in the Current Character register 13 and characters in the Look-Ahead Buffer 16 to determine if a run is about to commence in a manner to be further described. The compressor 10 further includes a Count Reduction Table 25 for use in run processing in accordance with the present invention. The Count Reduction Table 25 provides a Limit 26 in a manner to be explained. Details of the Count Reduction Table 25 and Limit 26 will be described below with respect to FIG. 2.

The compressor 10 further includes count reduction logic 27 for reducing the count value in the register 17 pursuant to the Count Reduction Table 25 in a manner to be described in accordance with the present invention. Further included in the compressor 10 is control 30 for controlling the operations of the compressor 10 in accordance with the operational flow charts of FIGS. 3 and 4 in a manner to be described.

Also included is a Dictionary 35 for storing character strings in cooperation with the compressor 10 in a manner to be described. Data is communicated between the compressor 10 and the Dictionary 35 via a bi-directional data bus 36 under control of a control bus 37.

Further included is an Input Character Buffer 40 that buffers the input data character stream received at the input 11. The individual input data characters are applied from the Input Character Buffer 40 via a bus 41 to the Current Character register 13, the Current Match register 14 and the Look-Ahead Buffer 16 in accordance with operations to be described. The compressor 10 controls acquiring input data characters from the Input Character Buffer 40 via a control bus 42.

Briefly, the operation of the compressor 10 is as follows. Input data characters are fetched from the Input Character Buffer 40 and conventional LZW data compression is performed thereon providing a compressed code stream at the output 12. In a well-known manner the Code Counter 23 is progressively incremented to assign code values to extended strings that are stored in the Dictionary 35. The compressor 10 is described herein in terms of a variable length code as is well understood in the art. When the count in the Code Counter 23 attains a maximum count as stored in the Maxcode register 20, the Code Size in the register 15 is incremented. The LZW compression algorithm is described in detail in said U.S. Pat. No. 4,558,302.

Using the Look-Ahead Buffer 16 and the look-ahead comparison logic 24, consecutive input characters are examined and if n (e.g. n=3) look-ahead characters are the same as the character in the Current Character register 13, the LZW process diverts to run-length encoding to process the character run. The number of characters in the run are counted using the Current Character register 13, the Count register 17 and the Character Temp register 21. If the run count in the Count register 17 is less than or equal to the difference between the maximum code in the Maxcode register 20 and the extant code in the Code Counter 23, the sum of the run count in the Count register 17 and the extant code in the Code Counter 23 is output. Otherwise, if the run count is less than the system maximum code, a first Reserved Code is output followed by the run count using the system maximum code size. If the run count is greater than or equal to the system maximum code, the count is reduced by a selected predetermined process so that the reduced count is less than the system maximum code. A further Reserved Code that corresponds to the selected predetermined process is output followed by the reduced count.

The embodiment described herein is, for purposes of explanation, illustrated in an ASCII implementation. The ASCII environment utilizes an 8 bit character size supporting an alphabet of 256 characters. In a variable length code implementation, the Code Size may begin with 9 bits and sequentially increase to 10, 11, 12, etc., bits at codes 512, 1024, 2048, etc., respectively. Typically in such systems, a maximum Code Size of 12 bits is utilized with a maximum system code of 4096.

In such an ASCII implementation, the set of Reserved Codes are conveniently larger than the largest character value and, as will be explained, conveniently begin at Reserved Code 257. In the embodiment to be described, five Reserved Codes are utilized ending at Reserved Code 261. Thus, in the ASCII implementation, the first available code from the Code Counter 23 for representing multiple character strings begins with code 262. It is appreciated that embodiments could also be predicated on a fixed length code output of, for example, 12 bits, as is well known.

Referring to FIG. 2, details of the Count Reduction Table 25 and Limit 26 of FIG. 1 are illustrated. The Count Reduction Table 25 defines a plurality of selectable predetermined processes so that a run count value may be reduced in a predetermined manner to a value less than the system maximum code. The Count Reduction Table 25 also defines Reserved Codes corresponding to the respective processes. Each of lines 50–53 of the Table 25 defines one of the processes. For purposes of specificity, the system maximum code is $2^{12}$ or 4096. The process 50, for example, is selected for count values that are greater than or equal to $2^{12}$ but less than $2 \times 2^{12}$. As seen in the Reduced Count column of the Table for process 50, run counts in this range are reduced by $2^{12}$. The Reserved Code for the process 50 is 258. For convenience, the decimal value of the upper limit for each count range is given in the so denoted column of the Table. For the parameters utilized, it is appreciated that the largest run count to be processed by the system is limited to runs of less than 20480 characters. It is furthermore appreciated that this Limit is increased by merely adding further lines to the Table.

The Count Reduction Table 25 is established for use in an ASCII environment where the characters are represented in 8 bits and have character values in the range of 0–255. The Reserved Codes are selected as 257–261. The first available code for representing multiple character strings is therefore 262. For purposes of specificity, the system maximum code size is 12 bits providing a system maximum code of 4096. Run counts that are less than the system maximum code may, in a manner to be later explained, be processed in a manner that is represented by the Reserved Code value of 257. The first line of Table 25 denotes this relationship.

Figure 3:
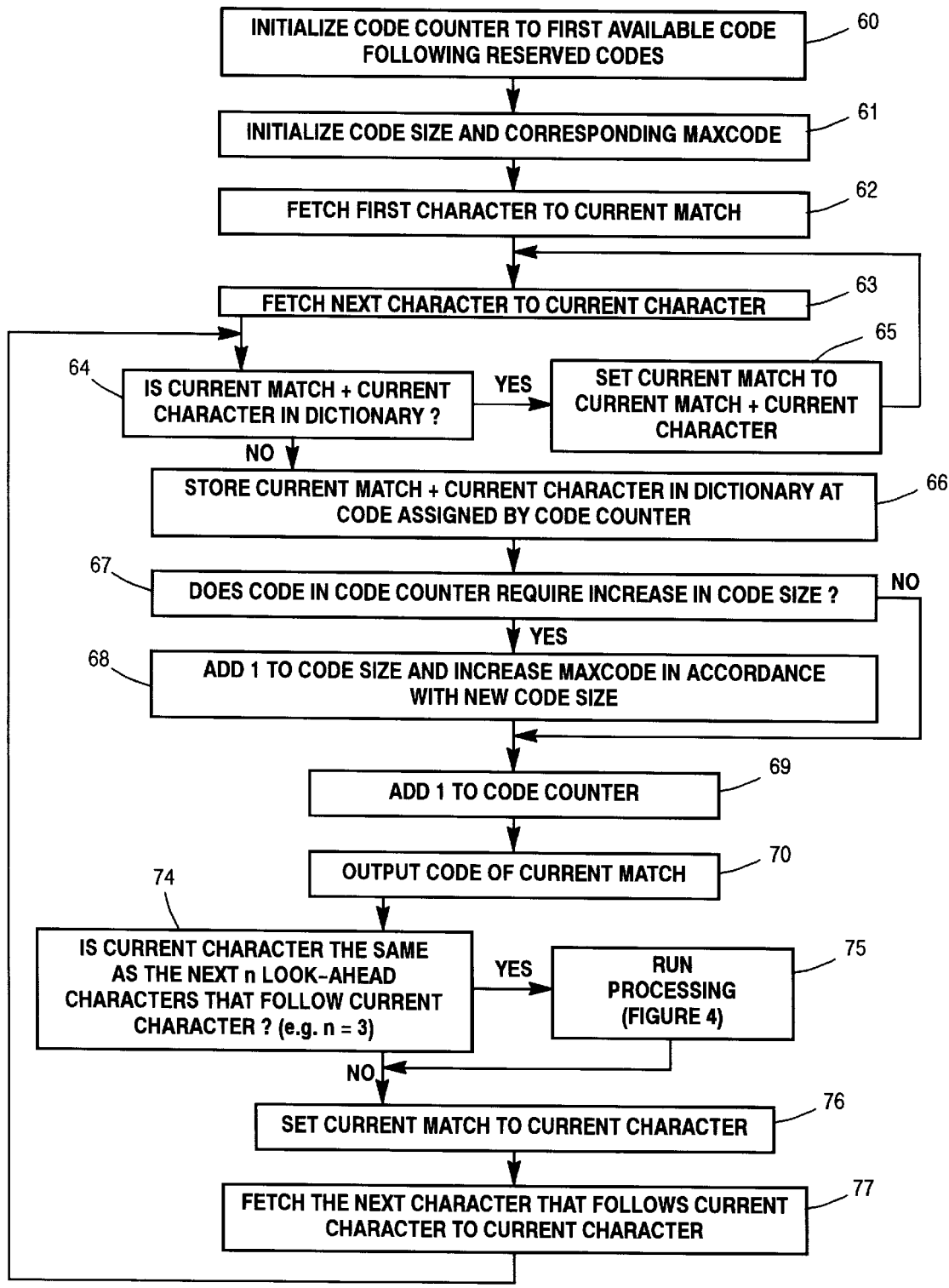
FIG. 3 is a control flow chart illustrating the operations executed by the compressor of FIG. 1 so as to perform data compression in accordance with the present invention.
Figure 4:
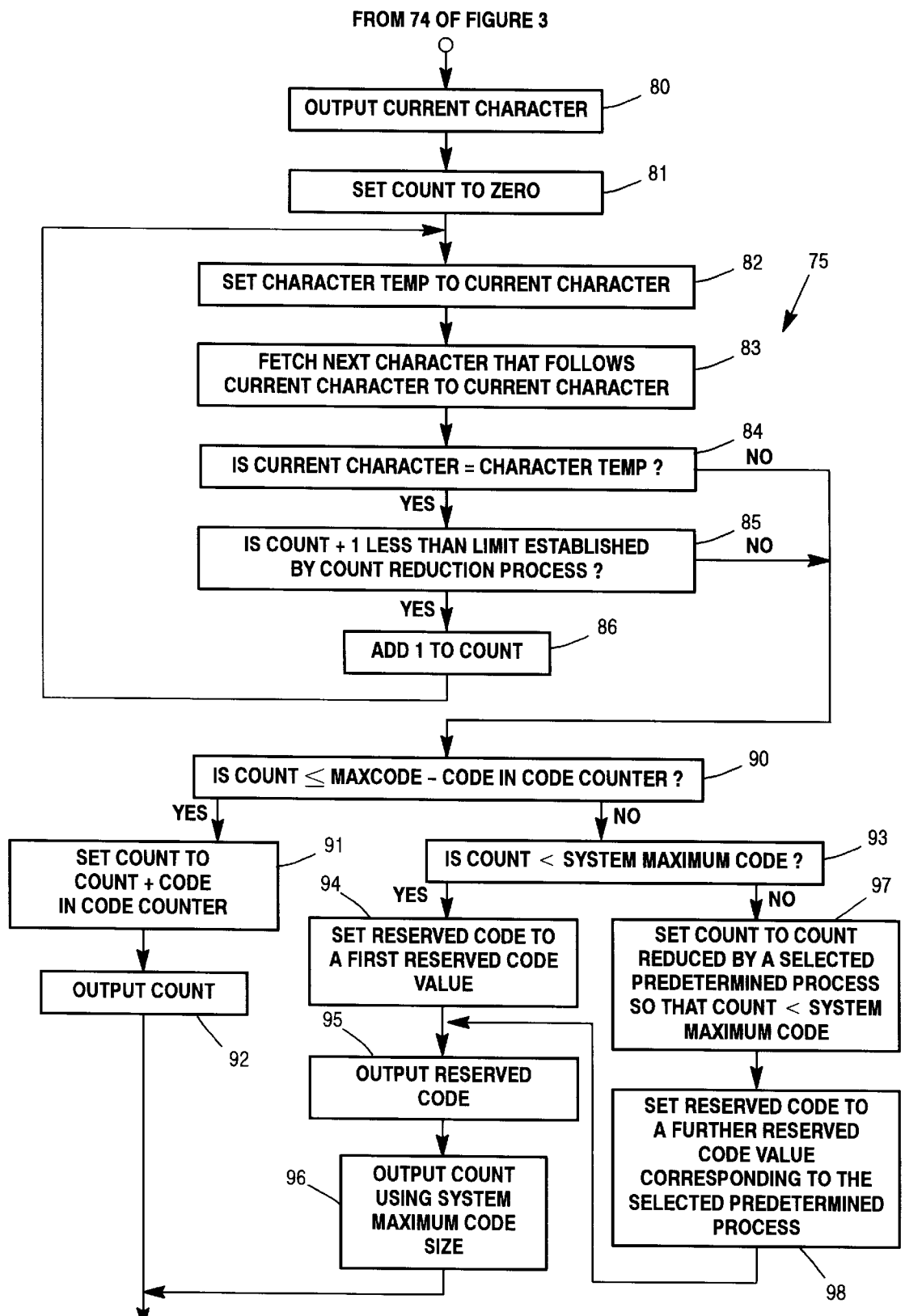
FIG. 4 is a control flow chart illustrating the run processing logic utilized in the flow chart of FIG. 3 so as to perform data compression in accordance with the features of the present invention.

With continued reference to FIG. 1, the conventional LZW processing utilizes the Current Character register 13, the Current Match register 14, the Code Size register 15, the Code Counter 23 and the Dictionary 35. The run processing in accordance with the present invention also utilizes the Code Counter 23 as well as the Look-Ahead Buffer 16, the Count register 17, the Maxcode register 20, the Character Temp register 21, the Reserved Code register 22, the look-ahead comparison logic 24, the Count Reduction Table 25, the Limit 26 and the count reduction logic 27. The control flow charts of FIGS. 3 and 4 illustrate the detailed operations to be executed by the compressor 10. The control 30 is considered as containing appropriate circuitry such as state machines to control execution of the operations.

Referring to FIG. 3, with continued reference to FIG. 1, at a block 60, the Code Counter 23 is initialized to the first available code following the Reserved Codes that are indicated in the Reserved Code set of the Count Reduction Table 25 of FIG. 2. Thus, in the illustrated embodiment, the Code Counter 23 is set to 262. At a block 61, the Code Size register 15 is initialized to the beginning Code Size, for example, 9 bits in the ASCII embodiment. Additionally, the Maxcode register 20 is set to the corresponding maximum code for the Code Size. As appreciated, the maximum code in 9 bits is 511. The Reserved Codes indicated in the block 60 and the Maxcode indicated in the block 61 are utilized in the run processing in accordance with the present invention in a manner to be described.

At a block 62, the first input character is fetched into the Current Match register 14 and, at a block 63, the next following character is fetched into the Current Character register 13. The value in the Current Match register 14 together with the next character in the Current Character register 13 comprise a two character string as is well appreciated in the art (e.g. see U.S. Pat. No. 4,558,302).

Processing continues at a block 64 wherein the Dictionary 35 is searched to determine if the string comprising the Current Match concatenated by the Current Character is in the Dictionary. Dictionary searching procedures are well known in the art for performing the function of the block 64 (e.g. see U.S. Pat. No. 4,558,302 and U.S. Pat. No. 5,861,827).

If at the block 64 the string is found in the Dictionary 35, the YES branch from the block 64 is taken to a block 65. At block 65, the contents of the Current Match register 14 is updated to contain an indication of the string that was found. As is well known in the art, a string has a code associated therewith and, generally, the string code of the currently matched string is set into the Current Match register 14. Details of specific implementations for the function of the block 65 are well known (e.g. see U.S. Pat. No. 4,558,302 and U.S. Pat. No. 5,861,827). After updating the Current Match register 14 with the currently matched string, control returns to the block 63 to fetch the next input data character to the Current Character register 13. In this manner, the loop formed by the blocks 63–65 compares the input data character stream with the strings stored in the Dictionary 35 to find the longest match therewith.

In the block 64, when the concatenation of the currently matched string with the next character fetched at the block 63 results in an extended string that is not in the Dictionary 35, the NO branch from the block 64 is taken to a block 66. At the block 66 this extended string that was not found in the Dictionary 35 is entered therein and the extant code of the Code Counter 23 is assigned to this stored extended string. Details of specific implementations for the function of the block 66 are well known (e.g. see U.S. Pat. No. 4,558,302).

Processing proceeds to a block 67 wherein the code in the Code Counter 23 is tested to determine if an increase in the Code Size is required. If so, processing continues to a block 68 whereat the Code Size register 15 is incremented by 1. If an increase in Code Size is required, the value in the Maxcode register 20 is also increased in accordance with the new Code Size. The value Maxcode is increased to the maximum code that will be supported by the new Code size bits. For example, a Code Size of 10 bits has a Maxcode of $(2^{10}-1)=1023$. The value in the Maxcode register 20 is utilized in the run processing of the present invention in a manner to be discussed with respect to FIG. 4. If an increase in Code Size is not required at the block 67, the block 68 is by-passed to continue processing at a block 69. At block 69, the Code Counter 23 is incremented by 1.

Processing continues at a block 70 whereat the code of the Current Match is output as part of the compressed code stream provided at the compressor output 12. The code of the Current Match is provided by the Current Match register 14. When Current Match is a multiple character string, the code of the string resides in the Current Match register 14 and was the longest match found in the Dictionary 35 as described above with respect to the block 64. It is appreciated that the Current Match that is output at the block 70 can also be a single character. The output code in this case is the value of the character. Implementation details of the functionality of block 70 are well known in the art (e.g. see U.S. Pat. No. 4,558,302 and U.S. Pat. No. 5,861,827).

Processing continues at a block 74 whereat the Current Character in the register 13 is tested against the next n look-ahead characters that follow Current Character to determine if they are the same. This process is performed by the logic 24 utilizing the appropriate characters fetched into the Look-Ahead Buffer 16. For example, n may be set equal to 3 for convenience.

At the block 74, the Current Character is compared to the next n look-ahead characters that follow Current Character to determine if a run of the same character is about to commence. If the Current Character is the same as the next n look-ahead characters, the YES branch of the block 74 is taken to a run processing block 75. The details of the run processing block 75 are illustrated in FIG. 4.

If one of the n look-ahead characters does not match Current Character, the NO branch of the block 74 is taken to continue the conventional LZW data compression processing.

Accordingly, processing continues at a block 76 whereat the Current Match register 14 is set to the character in the Current Character register 13. Thereafter, at a block 77, the next input data character that follows the present Current Character is fetched to the Current Character register 13. It is appreciated that, at the block 76, the Current Match register 14 is set to the input data character that resulted in a mismatch in the previous processing. Implementation details for the functionality of blocks 76 and 77 are well known in the art (e.g. see U.S. Pat. No. 4,558,302 and U.S. Pat. No. 5,861,827). Control then returns to the block 64 to begin a new LZW data compression cycle with the Current Match code that now resides in the Current Match register 14 and the Current Character that now resides in the Current Character register 13.

It is appreciated that aside from the blocks 74 and 75, the reference to Maxcode in the blocks 61 and 68 and the reference to Reserved Codes in the block 60, the remainder of FIG. 3 depicts standard LZW data compression processing. Thus, any known implementation of LZW data compression can be utilized in implementing the LZW data compression aspects of the present invention.

Referring to FIG. 4, with continued reference to FIGS. 1–3, the details of the run processing of the block 75 of FIG. 3 are illustrated. The run processing begins at a block 80 whereat the character in the Current Character register 13 is provided at the output 12 of the compressor 10. At a block 81, the Count in the Count register 17 is set to 0. Processing continues with a block 82 whereat the Current Character in the register 13 is saved to the Character Temp register 21. Thereafter, at a block 83, the next character that follows Current Character is fetched to the Current Character register 13.

At a block 84, the fetched character in the Current Character register 13 is compared to the preceding character in the Character Temp register 21 to determine equality therebetween. If Current Character is equal to Character Temp, the character run is continuing and the YES branch from the block 84 is taken. If, however, Current Character is not equal to Character Temp, the character run has ended with the mismatching character residing in the Current Character register 13. When, at the block 84, the end of the character run is indicated, the NO branch is taken therefrom.

The YES branch from the block 84 enters a block 85 whereat the Count in the Count register 17 is tested to determine if the Count, when incremented by 1, would remain less than the Limit 26 established by the Count reduction process. The Limit 26 was discussed above with respect to FIG. 2 and in the described implementation is equal to 20480 characters. It is appreciated that this Limit is implementation specific and can be significantly greater merely by adding further lines to the Count Reduction Table 25 as discussed above with respect to FIG. 2.

If Count+1 is less than the Limit at the block 85, processing continues with a block 86 whereat the Count in the Count register 17 is incremented by 1. Thus, the run count in the Count register 17 is incremented to count the run character just fetched at the block 83 which matches the character in the Character Temp register 21 at the block 84. Processing then loops back to the block 82 to continue counting the characters of the run.

The blocks 81–86 provide logic for counting the characters of the run. Other logic arrangements may be utilized to the same effect in performing this function.

If the run has ended at the block 84 or if the next Count will be greater than the Limit at the block 85, the respective NO branches proceed to a block 90. At the block 90 a test is made to determine if the Count in the Count register 17 is less than or equal to Maxcode minus the code in the Code Counter 23. The test of the block 90 is performed to determine if sufficient counts remain in the Code Counter 23 at the current Code Size to accommodate the Count of the run characters established by the blocks 81–86. If so, the Count of the run characters can be transmitted to the decompressor without using any special reserved code to signal the decompressor that run information is about to be received.

Accordingly, the YES branch from the block 90 is taken to a block 91 whereat the Count in the Count register 17 is added to the code from the Code Counter 23 with the resulting value set into the Count register 17. Processing then proceeds to a block 92 whereat the Count in the Count register 17 is provided at the output 12 of the compressor 10.

Processing then returns to the block 76 of FIG. 3 to re-enter the LZW processing loop.

If, at the block 90, the Count is greater than Maxcode minus the code in the Code Counter, the NO branch from the block 90 is taken to a block 93. The block 93 is the entrance to processing used when the Count of the run characters is too large to be accommodated by the processing of the blocks 91 and 92. The processing that follows the block 93 uses procedures delineated in the Count Reduction Table 25 as discussed above with respect to FIG. 2. In the processing entered from the block 93, the compressor 10 signals the occurrence of a run by outputting one of the Reserved Codes delineated in the Table 25.

Accordingly, at the block 93, the Count is tested to determine if it is less than the system maximum code. If so, processing proceeds to a block 94 at which the Reserved Code register 22 is set to the first Reserved Code value. As observed in the first line of the Table 25 of FIG. 2, the first Reserved Code of the illustrated embodiment is 257.

At a block 95, the first Reserved Code value now in the Reserved Code register 22 is provided to the output 12 of the compressor 10. Thereafter, at a block 96, the Count from the Count register 17 is provided to the output 12 of the compressor 10. The compressor 10 outputs this count value using the system maximum Code Size. As discussed above, the maximum Code Size for the disclosed embodiment is 12 bits. Other bit and Code Sizes may also be utilized in practicing the invention to the same effect. Processing from the block 96 returns to the block 76 of FIG. 3 to re-enter the LZW processing loop.

When, at the block 93, the Count is not less than the system maximum code, processing enters a block 97 followed by a block 98. At the blocks 97 and 98, a predetermined process is selected, as discussed above with respect to FIG. 2, from the processes 50–53 in accordance with the value of the Count in the Count register 17. Thus at the block 97, with reference to FIG. 2, the Count in the Count register 17 is reduced by the predetermined process that is selected so that the reduced Count is less than the system maximum code. This reduced Count is then set into the Count register 17. For example, if the count before reduction is greater than or equal to $3\times2^{12}$ and less than $4\times2^{12}$, the process 52 is selected wherein the Count in the Count register 17 is reduced by $3\times2^{12}$.

At the block 98, the Reserved Code register 22 is set to a Reserved Code value that corresponds to the selected predetermined process. Thus, when the predetermined process 52 is selected, the Reserved Code register 22 is set to 260.

Processing then continues with the blocks 95 and 96 whereat the Reserved Code from the Reserved Code register 22 and the Count from the Count register 17 are output to signal the occurrence of the run processed in the blocks 97 and 98 and to convey the run count therefor. Processing then returns to the block 76 of FIG. 3 to re-enter the LZW data processing loop.

It is appreciated from the processing of the blocks 93–98 that very large runs can be accommodated by the system of the present invention. The specific embodiment illustrated can accommodate 20479 run characters utilizing the predetermined process 53.

Figure 5:
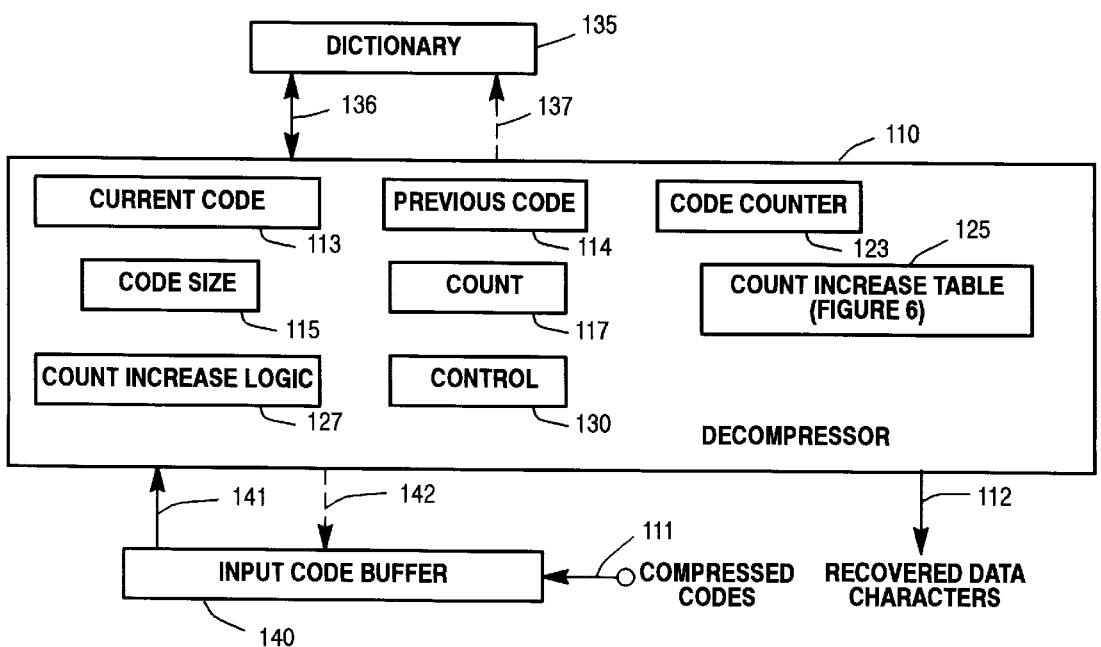
FIG. 5 is a schematic block diagram of a data decompressor embodied in accordance with the present invention for recovering data compressed by the compressor of FIG. 1.

Referring to FIG. 5, with continued reference to FIG. 1, a data decompressor 110 is illustrated that decompresses a stream of compressed codes applied at an input 111 into a recovered stream of data characters at an output 112. It is appreciated that the compressed code stream from the output 12 of the compressor 10 (FIG. 1), if applied to the input 111 of the decompressor 110, results in the recovery, at the output 112 of the decompressor 110, of the original input data character stream applied to the input 11 of the compressor 10.

The decompressor 110 includes working registers denoted as a Current Code register 113, a Previous Code register 114, a Code Size register 115 and a Count register 117. The decompressor 110 further includes a Code Counter 123 for sequentially generating code values that are used to process incoming compressed codes in a manner to be described. It is appreciated that the Code Counter 123 will maintain a lock-step relationship with the Code Counter 23 of the compressor 10 of FIG. 1 as will be appreciated from the descriptions to follow.

The decompressor 110 also includes a Count Increase Table 125 utilized in processing incoming compressed codes representative of data character runs. Details of the Count Increase Table 125 will be described with respect to FIG. 6. Also included is count increase logic 127 utilized together with the Count Increase Table 125 for restoring incoming reduced count values to appropriate run count values. The count increase logic 127 and Count Increase Table 125 reverses the count reduction effected by the Count Reduction Logic 27 and Count Reduction Table 25 of the compressor 10 of FIG. 1.

Figure 7:
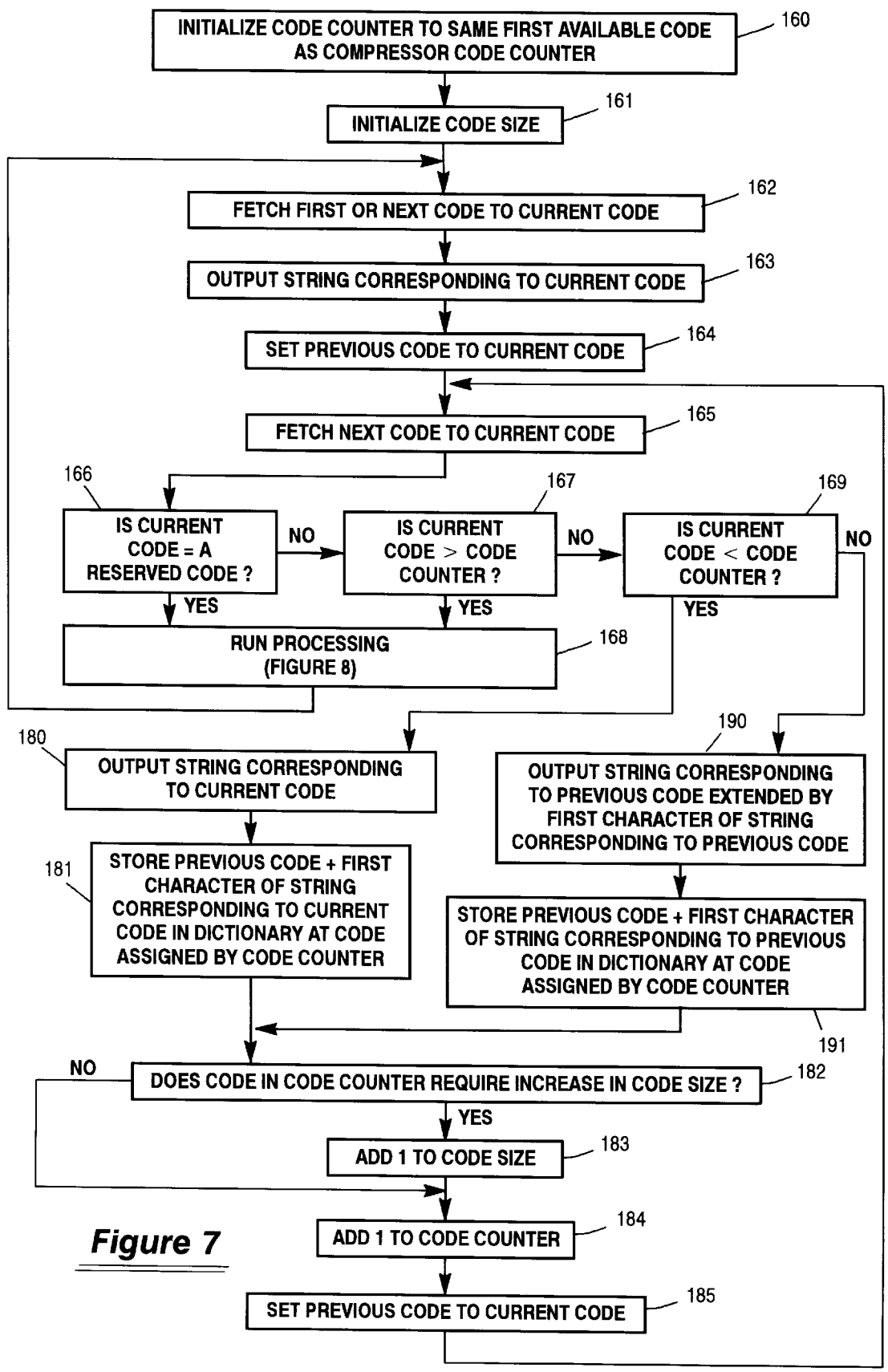
FIG. 7 is a control flow chart illustrating the operations executed by the decompressor of FIG. 5 so as to perform data decompression in accordance with the present invention.
Figure 8:
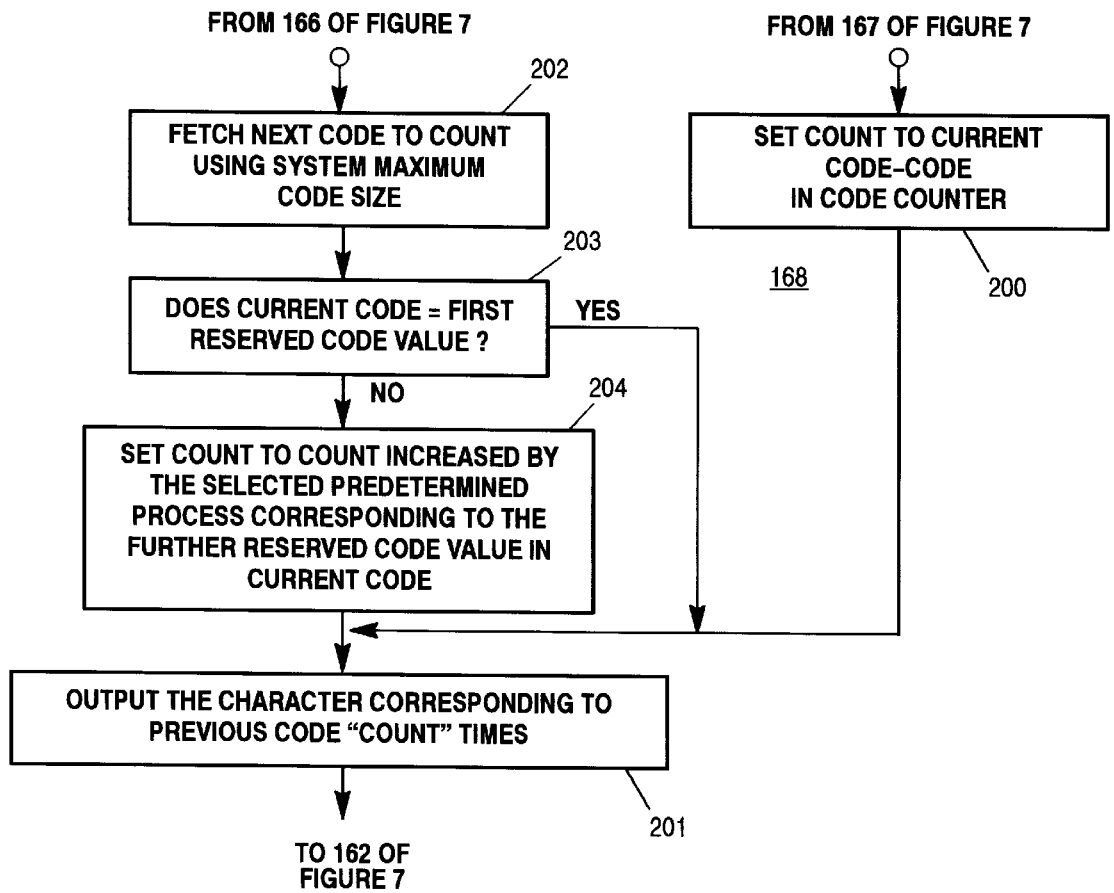
FIG. 8 is a control flow chart illustrating the run processing logic utilized in the flow chart of FIG. 7 so as to perform data decompression in accordance with the features of the present invention.

Further included in the decompressor 110 is control 130 for controlling the operations of the decompressor 110 in accordance with the operational flow charts of FIGS. 7 and 8 in a manner to be described.

A Dictionary 135 is included for storing data character strings corresponding to received compressed code inputs. In the operation of the decompressor 110, the contents of the Dictionary 135 are maintained identical to the contents of the Dictionary 35 of the compressor 10 of FIG. 1. The Dictionary 135 is coupled to the decompressor 110 via a bi-directional data bus 136 and a control bus 137.

Included with the decompressor 110 is an Input Code Buffer 140 that buffers the input compressed codes received at the input 111. The individual input codes are applied from the Input Code Buffer 140, via a bus 141, to the Current Code register 113 in accordance with operations to be described. The decompressor 110 controls acquiring input codes from the Input Code Buffer 140 via a control bus 142.

Briefly, the operation of the decompressor 110 is as follows. A code fetched to the Current Code register 113 is examined to determine if it greater than the extant code of the Code Counter 123. If so, the input code represents a run count which is recovered by subtracting the extant code in the Code Counter 123 from the received input code. If the input Current Code is equal to a Reserved Code, the next following code is fetched which is a run count. The received run count value is processed in accordance with the value of the particular Reserved Code. In both instances where the input data represents a character run, the character is obtained from the Previous Code register 114 and the run count is obtained in a manner to be further described.

If the input Current Code is less than or equal to the extant code of the Code Counter 123, standard LZW data decompression is performed to recover the data character string corresponding to the input Current Code. Extended strings are stored in the Dictionary 135 in a manner well understood in the art of LZW data decompression.

Referring to FIG. 6, with continued reference to FIG. 5, details of the Count Increase Table 125 are illustrated. As indicated in lines 150–153, the run count is recovered from an input code received by the decompressor 110 by adding the illustrated values to the received code in accordance with the respective received Reserved Code as depicted. Specifically lines 150–153 of the Table 125 indicate that in response to receiving Reserved Codes 258–261, respectively, the Count is increased by $2^{12}$; $2\times2^{12}$; $3\times2^{12}$ or $4\times2^{12}$, respectively. In response to the Reserved Code 257, the received count is used directly without increase as will be further explained. The first line of Table 125 depicts this relationship.

The control flow charts of FIGS. 7 and 8 illustrate the detailed operations to be executed by the decompressor 110. The control 130 is considered as containing appropriate circuitry such as state machines to control execution of the operations.

Referring to FIG. 7, with continued reference to FIGS. 5 and 6, at a block 160 the Code Counter 123 is initialized in the same manner as described above with respect to the block 60 of FIG. 3. At a block 161, the Code Size register 115 is initialized to the beginning Code Size as explained above with respect to the block 61 of FIG. 3.

At a block 162, the first or the next input compressed code is fetched to the Current Code register 113. If control proceeds from block 161 to block 162, the code that is fetched will be the first code. If control enters block 162 via the illustrated return path from run processing, the code that is fetched will be the next code rather than the first code.

At a block 163, the decompressor 110 provides, at its output 112, the string of data characters corresponding to the compressed code fetched into the Current Code register 113. Data character string recovery from an input compressed code using the Dictionary 135 is well known in the art of LZW data decompression. Numerous specific implementations are well known for the function of the block 163 (e.g. see U.S. Pat. No. 4,558,302).

It is appreciated that the code fetched to the Current Code register 113 may represent either a single character string or a multi-character string. As is well known, such strings are distinguished from one another by the value of the code. Generally, multi-character strings are represented by codes that are greater than or equal to the first available code discussed above with respect to the block 160. Codes for single character strings generally have values equal to, or representative of, the single character and therefore have values less than the first available code.

At a block 164, the code in the Current Code register 113 is transferred to the Previous Code register 114. At a block 165, the next input compressed code is fetched to the Current Code register 113.

At a block 166, the code in the Current Code register 113 is tested to determine if it is equal to a Reserved Code. In the illustrated embodiment, the reserved codes are 257–261 as denoted in the Count Increase Table 125 of FIG. 6. If Current Code is not equal to a Reserved Code, the NO branch from the block 166 is taken to a block 167. At the block 167, the code in the Current Code register 113 is tested to determine if it greater than the extant code in the Code Counter 123. If Current Code is not greater than Code Counter, the NO branch from block 167 is taken to a block 169.

If, however, the Current Code is equal to a Reserved Code, the YES branch from the block 166 is taken to a run processing block 168. Similarly, if Current Code is greater than Code Counter, the YES branch from the block 167 is taken to the run processing block 168. Details of the decompression run processing will be described with respect to FIG. 8. After the code or codes for a run have been processed and the run has been recovered, control returns to block 162.

At a block 169, the code in the Current Code register 113 is tested to determine if it is less than or equal to the extant code of the Code Counter 123. (Only "less than" testing is used because of the previous testing of blocks 166 and 167). If Current Code is less than Code Counter, the YES branch from block 169 is taken to a sequence of blocks 180–185. If Current Code is equal to Code Counter, the NO branch from the block 159 is taken to a sequence of blocks 190 and 191. It is appreciated that the blocks 180–185 represent well-known normal LZW data decompression processing and that the blocks 190 and 191 represent well-known exception case LZW data decompression processing (e.g. see U.S. Pat. No. 4,558,302).

At the block 180, the data character string corresponding to the code in the Current Code register 113 is provided by the decompressor 110 at the output 112 thereof.

At the block 181, the Dictionary 135 is updated by storing an extended string comprising the string corresponding to the code in the Previous Code register 114 extended by the first character of the string corresponding to the code in the Current Code register 123. This stored extended string is assigned the string code value of the extant code of the Code Counter 123. In conventional LZW implementations, the code in the Previous Code register 114, together with the extension character, is stored in Dictionary 135 at a location designated by the code assigned by the Code Counter 123.

At blocks 182–184, the Code Counter 123 is advanced by 1 and a Code Size increment is effected if required. If a Code Size increase is not required, the test of block 182 results in by-passing the Code Size incrementation block 183. The Code Size register 115 is utilized in this process. The incrementation of the Code Counter 123 to the next code is performed at the block 184.

At the block 185, the code in the Current Code register 113 is transferred to the Previous Code register 114. In conventional LZW data decompression, the Previous Code set into the Previous Code register 114 at the block 185 is utilized in the following LZW data decompression cycle in the dictionary updating function of block 181. In the run processing of the present invention, this Previous Code is utilized to define the run character in a manner to be explained with respect to FIG. 8. Control from the block 185 is returned to the block 165.

If LZW exception case processing is required, the NO branch from the block 169 is taken to the block 190 whereat the string corresponding to the code in the Previous Code register 114 is extended by the first character of this string and is provided at the output 112 of the decompressor 110. At the block 191, this extended string of the block 190 is stored in the Dictionary 135 with an assigned code of the code in the Code Counter 123. Control then continues with the block 182 as previously described.

The blocks 160–165, 169, 180–185 and 190–191 of FIG. 7 comprise the processing performed by a conventional LZW data decompressor. Numerous implementations are known for performing the functions of these blocks (e.g. see U.S. Pat. No. 4,558,302).

The blocks 166–168 comprise decompression run processing in accordance with the present invention embedded in a conventional LZW decompressor.

It is appreciated in FIG. 7 that the conventional LZW processing of blocks 180–185 and 190–191 return processing to the block 165 to fetch the next code to the Current Code register 113. In distinction to this, the run processing of block 168 returns processing to the block 162. This is to effectively re-initialize the Previous Code register 114 at block 164 after a run has been processed so that the decompressor 110 continues to remain synchronized with the output from the compressor 10.

Referring to FIG. 8, with continued reference to FIGS. 5–7, details of the run processing block 168 of FIG. 7 are illustrated. If, as discussed above with respect to blocks 166 and 167 of FIG. 7, the code in the Current Code register 113 is not equal to a Reserved Code but is greater than the extant code in the Code Counter 123, control transfers from the block 167 of FIG. 7 to a block 200 of FIG. 8. At the block 200, the extant code in the Code Counter 123 is subtracted from the code in the Current Code register 113 and the result is set into the Count register 117. At a block 201, the decompressor 110 repeatedly provides, at its output 112, the character residing in the Previous Code register 114 a number of times equal to the number in the Count register 117. In this manner, the decompressor 110 recovers the data character run that was compressed by the compressor 10. Control then returns to block 162 of FIG. 7.

If the input code in the Current Code register 113 is equal to a Reserved Code indicated in the Count Increase Table 125 of FIG. 6, control transfers from the block 166 of FIG. 7 to a block 202 of FIG. 8. At the block 202, the next input code is fetched to the Count register 117 using the system maximum Code Size. At a block 203, a test is executed to determine if the Current Code is equal to the first Reserved Code value. For the described embodiment, the first Reserved Code, as indicated in FIG. 6, is 257. If at the block 203, Current Code is equal to the first Reserved Code, control transfers to the block 201 and the associated data character run is recovered as previously described.

If, however, at the block 203, the Current Code is not equal to the first Reserved Code, control transfers to a block 204 whereat the Count in the Count register 117 is increased by the selected predetermined process corresponding to the further Reserved Code value in the Current Code register 113. As previously described, the Count Increase Table 125, as detailed in FIG. 6, illustrates the specific predetermined processes 150–153 corresponding to the Reserved Codes 258–261, respectively. Depending on the Reserved Code that is received, the Count is increased as illustrated. Thereafter, processing continues with the block 201, as previously described, to recover the associated data character run.

It is appreciated, as previously described, that for the illustrated embodiment, a run of 20479 characters can be accommodated. Longer runs can be accommodated by the decompressor 110 simply by adding further lines to the Count Increase Table 125 of FIG. 6. Of course, corresponding further lines would be added to the Count Reduction Table 25 of FIG. 2 as previously explained.

It is appreciated that the functionality of the blocks 200, 203 and 204 of FIG. 8 is performed by the count increase logic 127 of FIG. 5 using the Count register 117, the Code Counter 123 and the Count Increase Table 125 of FIG. 5.

In all of the run processing described above, it is appreciated that the run character is transmitted at compressor block 80 of FIG. 4 and, at the decompressor, conveniently resides in the Previous Code register 114 as the result of the processing of block 185 of FIG. 7.

With continued reference to FIGS. 2, 4, 6, 7 and 8, it is appreciated that whatever the run processing that is applied by the compressor (FIGS. 2 and 4), it is reversed by the decompressor run processing (FIGS. 6 and 8) so that the original run input data is recovered.

The compressor processing of blocks 90–92 of FIG. 4 is reversed by blocks 167, 200 and 201 of FIGS. 7 and 8. In this aspect of the invention, the Count of the run is transmitted by the processing of blocks 91 and 92. The sum of the run count and the extant code of the compressor code counter is output at block 92 and at block 200 of the decompressor processing, the extant value of the decompressor code counter is subtracted from the received code to recover the run count. The decompressor recognizes this character run condition by detecting, at block 167, that the received code is greater than the extant code of the decompressor code counter. Using this processing of the present invention, it is not necessary to transmit a Reserved Code from the compressor to the decompressor to signal the existence of the run.

The compressor processing of blocks 93–96 of FIG. 4 is reversed by decompressor blocks 166 and 201–203 of FIGS. 7 and 8. In this case, the first Reserved Code value is utilized to signal the decompressor of the particular processing. The Reserved Code value of 257 is utilized in the above-described embodiment. In this processing, the run count is transmitted by the compressor following this first Reserved Code. The decompressor, after receiving this first Reserved Code, utilizes the received run count to recover the character run.

The compressor run processing of blocks 93, 97, 98, 95 and 96 of FIG. 4 is reversed by the decompressor processing of blocks 166 and 201–204. In the compressor processing of blocks 97 and 98, the run count is reduced by a selected predetermined process so that Count is less than the system maximum code and a Reserved Code is utilized that corresponds to the selected predetermined process. The decompressor processing recognizes the Reserved Code and, by utilizing the inverse of the selected predetermined process, increases the received count to the original run count value so as to recover the original character run. The compressor predetermined processes 50–53 of FIG. 2 correspond, respectively, to the decompressor predetermined processes 150–153 of FIG. 6. It is observed that the decompressor predetermined processes of FIG. 6 are the inverses of the compressor predetermined processes of FIG. 2.

The above described embodiments of the invention are illustrated in terms of variable code length. It is appreciated that the above embodiments may also be utilized in a fixed code length environment with some readily apparent modifications. For example, a fixed code length embodiment may utilize a fixed code size of 12 bits. In this configuration, the maximum system code would be 4096.

In a fixed code length embodiment, the Code Size registers 15 and 115 of FIGS. 1 and 5 would not be utilized. Similarly, the Code Size initialization, test and incrementation of blocks 61, 67 and 68 of FIG. 3, as well as corresponding blocks 161, 182 and 183 of FIG. 7 would not be required. In such an embodiment, Maxcode would be fixed and would be equal to the fixed system maximum code, e.g. 4096. The logic of FIGS. 3, 4, 7 and 8 would then remain the same except that the system maximum code and the system maximum code size would be the fixed values as discussed.

Referring to FIG. 9, with continued reference to FIGS. 1–4, an example of the operation of the compressor 10 in accordance with the flow charts of FIGS. 3 and 4, is illustrated. At the top of the Figure, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIGS. 3 and 4 that participate in the actions designated in the right-hand column. It is noted that the run of the character "a" is 47 characters long and the run of the character "c" is 15000 characters long.

In actions 1–8, standard LZW data compression is performed on the input data characters through the character "a(5)". Several LZW compression cycles are performed and in each cycle, as noted in the right-hand column, the block 74 is traversed to test for a character run. With the block 74 positioned in the processing as illustrated in FIG. 3, all strings that exist in the Dictionary 35 will be matched in the block 64 of FIG. 3 prior to invoking run processing at the block 74. Therefore, the LZW processing is taking precedence over the run processing.

In action 8, block 74 of FIG. 3 recognizes that the Current Character "a(5)" is the same as the next n look-ahead characters as observed in the input data character stream at the top of the Figure. Control then proceeds to the block 75 for run processing. It is appreciated that even though the illustrated run of the character "a" begins with "a(4)", the character "a(4)" was absorbed into the LZW processing at action 6.

In action 9, the character "a(5)" is output pursuant to the block 80 of FIG. 4 and the run counting begins with character "a(6)". The loop comprised of the blocks 82–86 of FIG. 4 counts the characters and at action 12 the mismatching character "c(1)" is fetched stopping the count at 45 as illustrated. In action 12, the block 90 of FIG. 4 determines that the count of 45 in the Count register 17 of FIG. 1 is less than the difference between Maxcode and the code of 266 in the Code Counter 23.

In action 13, blocks 91 and 92 of FIG. 4 add the code counter value of 266 with the count value of 45 to provide a Count of 311 which is output. Control then returns to block 76 of FIG. 3 to resume the LZW processing wherein the next character "c(2)" is fetched and the Dictionary is updated as illustrated.

In actions 14–18, the 15000 character run of the data character "c" is processed. In action 18, the blocks 90 and 93 of FIG. 4 direct the processing to the blocks 97 and 98 thereof. In action 19, the count of 14998 is reduced to a count of 2710 by utilizing the process 52 of FIG. 2. The corresponding Reserved Code of 260 is set into the Reserved Code register 22 of FIG. 1 as illustrated. This code is then output at the block 95 of FIG. 4, as illustrated in action 19, followed by the reduced count of 2710 at action 20. The block 96 of FIG. 4 depicts the outputting of the Count.

In actions 20–22, processing returns to LZW data compression at the block 76 of FIG. 3.

More detailed descriptions of the actions of FIG. 9 relative to the blocks of FIGS. 3 and 4 are readily apparent and will not be provided for brevity.

Referring to FIG. 10, with continued reference to FIGS. 5, 6, 7 and 8, an example of the operation of the decompressor 110 in accordance with the flow charts of FIGS. 7 and 8 is illustrated. The format of FIG. 10 is generally similar to that of FIG. 9 and descriptions given above with respect to FIG. 9 are applicable. The input compressed code stream at the top of FIG. 10 is the compressor output illustrated in FIG. 9. It is observed that the output of FIG. 10 is the recovered data character stream illustrated at the top of FIG. 9.

In actions 1–5, conventional LZW decompression is performed recovering the original data character stream through character "a(5)". It is noted that LZW exception case processing is performed at action 4 where the received Current Code is equal to the decompressor Code Counter (NO branch of block 169 of FIG. 7).

At action 6, the run of the character "a" is processed in response to receiving the code 311. In this case, the received compressed code is greater than the value 266 in the decompressor Code Counter. The block 167 of FIG. 7 directs processing to the blocks 200 and 201 of FIG. 8 to perform the recovery of the run characters. In actions 7 and 8, control returns to LZW processing at block 162 of FIG. 7 to detect the beginning of the run of the character "c".

In actions 9 and 10, the run of the character "c" is processed. In action 9, the Reserved Code 260 is received as detected at block 166 of FIG. 7 and the run processing of blocks 201–204 of FIG. 8 is invoked. In action 9, the Count of 2710 is received and in action 10 converted to the run count of 14998. The conversion is performed at block 204 of FIG. 8 using the process 152 of FIG. 6.

In actions 11–13, conventional LZW decompression decodes the remainder of the input compressed code stream.

More detailed descriptions of the actions of FIG. 10 relative to the blocks of FIGS. 7 and 8 are readily apparent and will not be provided for brevity.

As appreciated from FIG. 3, the run detection of block 74 and the run processing of block 75 is interposed in the LZW data compression cycle of FIG. 3 at the point in the LZW cycle where the longest match has been output, the Dictionary has been updated with the extended string and the character that caused the mismatch has been fetched and resides in the Current Character register. In this manner, full compression advantage is obtained with respect to strings already stored in the Dictionary. If the mismatching character should begin a run, this character is output at block 80 of FIG. 4 permitting the decompressor Dictionary to store the same extended string as stored in the compressor Dictionary. When the run processing of FIG. 4 is concluded, the mismatching character following the run is in the Current Character register and is then available at the block 76 of FIG. 3 to continue the LZW processing from this point. Thus, at the block 76 of FIG. 3, the Current Match register utilized in the LZW process either receives the mismatching character from the LZW processing of the blocks 60–70 or from the run processing block 75.

It is appreciated that the predetermined processes of FIGS. 2 and 6 utilize subtraction and addition to decrease and increase the Count, respectively. Other procedures may be utilized in the context of the present invention to process long runs. For example, other mathematical procedures with greater number reducing and increasing capabilities than subtraction and addition may be utilized. Multiplication, division, exponentiation and hashing techniques may be employed to provide this capability.

It is understood that the protocols utilized in the compressor 10 and the decompressor 110 should be compatible with respect to each other. The compressor and decompressor should operate over the same alphabet size and initial conditions such as Code Size. The above-described compressor and decompressor embodiment can readily be utilized with dictionaries that are either not initialized or are initialized with all of the single character strings. As described above, single characters can be distinguished from compressed codes by the respective values thereof. The single characters can be represented by the values of the characters themselves or by any other well-known coding scheme. The single character protocol that is used in the compressor should also be utilized in the decompressor.

It is appreciated that the input to the compressor can be over any size alphabet having any corresponding character bit size. For example, the data characters can be textual, such as ASCII characters, over an alphabet, such as the 256 character ASCII alphabet of 8-bit characters. The input data can also be binary characters over the two character binary alphabet 1 and 0 having a 1-bit sized character. It is appreciated that textual data can also be compressed over the two character alphabet of the underlying binary data.

It is appreciated that the above-described embodiment of the invention may be implemented in hardware, firmware, software or a combination thereof. Discrete circuit components may readily be implemented for performing the various described functions. In a software embodiment, appropriate modules, programmed with coding readily generated from the above-described flow charts, may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, said method including an LZW data compression process, said LZW data compression process including storing strings of data characters, assigning respective codes to said stored strings from a code counter and incrementing said code counter for each said stored string, said method comprising:

detecting when a run of data characters is occurring in said input stream by detecting when a predetermined number of adjacent data characters of said input stream are the same with respect to each other, counting data characters in said detected run to provide a run count, providing a modified code by combining the existing code in said code counter with said run count, using said LZW data compression process to compress said input stream when a run is not occurring therein by comparing said input stream to said stored strings to determine longest matches therewith and providing said codes assigned thereto, thereby providing LZW compressed codes, and outputting said modified code and said LZW compressed codes so as to provide said output stream.

2. The method of claim 1 wherein said providing step comprises providing said modified code so that when said modified code is received by an LZW data decompression process, said run count may be recovered by combining the received modified code with the existing code in the code counter used in said LZW data decompression process.

3. The method of claim 2 wherein said step of providing a modified code comprises providing said modified code by adding said run count to said existing code in said code counter of said LZW data compression process.

4. The method of claim 3 wherein said run count is recovered by subtracting said existing code in said code counter of said LZW data decompression process from said received modified code.

5. The method of claim 1 wherein said outputting step further comprises outputting the data character of said detected run prior to said modified code.

6. The method of claim 1 wherein said steps of detecting when a run of data characters is occurring, counting data characters in said detected run, providing a modified code and outputting said modified code comprises run processing, said storing step of said LZW data compression process comprises storing extended strings, each comprising a longest match extended by the next following data character in said input stream, said method further including performing said run processing during said step of using said LZW data compression process after determining a longest match, storing the extended string corresponding thereto and providing the code assigned to said longest match.

7. The method of claim 6 wherein said LZW data compression process determines said longest match by fetching said next following data character in said input stream thereby resulting in a mismatch with said stored strings, said fetched input data character being a mismatching character, said performing step further comprises performing said run processing beginning with said mismatching character, and said detecting step further comprises detecting when said run is occurring by detecting when said predetermined number of said adjacent data characters are the same as said mismatching character.

8. The method of claim 7 wherein said step of outputting further comprises outputting the data character of said detected run prior to said modified code, said data character of said detected run comprising said mismatching character.

9. A data compression method for compressing an input stream of data characters into an output stream of compressed codes, said method including an LZW data compression process, said LZW data compression process including storing strings of data characters, assigning respective codes to said stored strings from a code counter and incrementing said code counter for each said stored string, said method comprising:

detecting when a run of data characters is occurring in said input stream by detecting when a predetermined number of adjacent data characters of said input stream are the same with respect to each other, counting data characters in said detected run to provide a run count, providing a reduced count by reducing said run count to less than a predetermined number by using a selected predetermined process, providing a reserved code corresponding to said selected predetermined process, using said LZW data compression process to compress said input stream when a run is not occurring therein by comparing said input stream to said stored strings to determine longest matches therewith and providing said codes assigned thereto, thereby providing LZW compressed codes, and outputting said reserved code, said reduced count and said LZW compressed codes so as to provide said output stream.

10. The method of claim 9 wherein said providing steps comprise providing said reserved code and said reduced count so that when said reserved code and said reduced count are received by an LZW data decompression process, said run count may be recovered by increasing said received reduced count by using the inverse of said selected predetermined process.

11. The method of claim 9 wherein said outputting step comprises outputting the data character of said detected run prior to said reserved code.

12. The method of claim 9 wherein said steps of detecting when a run of data characters is occurring, counting data characters in said detected run, providing a reduced count, providing a reserved code and outputting said reserved code and said reduced count comprises run processing, said storing step of said LZW data compression process comprises storing extended strings, each comprising a longest match extended by the next following data character in said input stream, said method further including performing said run processing during said step of using said LZW data compression process after determining a longest match, storing the extended string corresponding thereto and providing the code assigned to said longest match.

13. The method of claim 10 wherein said selected predetermined process comprises subtracting a predetermined constant from said run count so as to reduce said run count to less than said predetermined number, said reserved code corresponding to said predetermined constant.

14. The method of claim 13 wherein said run count is recovered by adding said predetermined constant corresponding to said received reserved code to said received reduced count.

15. The method of claim 12 wherein said LZW data compression process determines said longest match by fetching said next following data character in said input stream thereby resulting in a mismatch with said stored strings, said fetched input data character being a mismatching character, said performing step further comprises performing said run processing beginning with said mismatching character, and said detecting step further comprises detecting when said run is occurring by detecting when said predetermined number of said adjacent data characters are the same as said mismatching character.

16. The method of claim 15 wherein said step of outputting further comprises outputting the data character of said detected run prior to said reserved code, said data character of said detected run comprising said mismatching character.

17. A data decompression method for decompressing an input stream of compressed codes to recover an output stream of data characters corresponding thereto, said method including an LZW data decompression process, said LZW data decompression process including storing strings of data characters, assigning respective codes to said stored strings from a code counter and incrementing said code counter for each said stored string, said method comprising:

comparing a received input compressed code to the existing code in said code counter to determine if said received input compressed code represents a run count, recovering said run count by combining said received input compressed code with said existing code in said code counter, repeatedly providing the data character represented by the compressed code received prior to said received input compressed code, said data character being repeatedly provided a number of times corresponding to said recovered run count, thereby providing a recovered run, using said LZW data decompression process to provide said stored strings corresponding to received compressed codes when said received compressed codes do not denote run counts, thereby providing LZW recovered strings, and outputting said recovered run and said LZW recovered strings so as to provide said output stream.

18. The method of claim 17 wherein said comparing step comprises comparing said received input compressed code to said existing code in said code counter to determine if said received input compressed code is greater than said existing code in said code counter, thereby determining that said received input compressed code represents a run count.

19. The method of claim 17 wherein said recovering step comprises recovering said run count by subtracting said existing code in said code counter from said received input compressed code, thereby providing said recovered run count.

20. The method of claim 17 wherein said storing step of said LZW data decompression process comprises storing extended strings, said storing step including storing an extended string that is extended by said data character represented by said prior received compressed code.

21. The method of claim 17 wherein said steps of comparing a received input compressed code, recovering said run count, repeatedly providing the data character and outputting said recovered run comprises run processing, said LZW data decompression process includes an initial processing point at which a first compressed code is fetched, said method further including returning to said initial processing point after performing said run processing.

22. A data decompression method for decompressing an input stream of compressed codes to recover an output stream of data characters corresponding thereto, said method including an LZW data decompression process, said LZW data decompression process including storing strings of data characters, assigning respective codes to said stored strings from a code counter and incrementing said code counter for each said stored string, said method comprising:

determining if a received input compressed code is equal to a reserved code, said reserved code denoting that a run count will follow that has been reduced by a selected predetermined process corresponding to said received reserved code, fetching said reduced run count, recovering said run count by increasing said fetched reduced run count by using the inverse of said selected predetermined process corresponding to said received reserved code, repeatedly providing the data character represented by the compressed code received prior to said received reserved code, said data character being repeatedly provided a number of times corresponding to said recovered run count, thereby providing a recovered run, using said LZW data decompression process to provide said stored strings corresponding to received compressed codes when said received compressed codes do not denote run counts, thereby providing LZW recovered strings, and outputting said recovered run and said LZW recovered strings so as to provide said output stream.

23. The method of claim 22 wherein said selected predetermined process comprises subtracting a predetermined constant corresponding to said reserved code from said run count, thereby providing said reduced run count.

24. The method of claim 23 wherein said recovering step comprises recovering said run count by adding said predetermined constant corresponding to said received reserved code to said fetched reduced run count.

25. The method of claim 22 wherein said storing step of said LZW data decompression process comprises storing extended strings, said storing step including storing an extended string that is extended by said data character represented by said prior received compressed code.

26. The method of claim 22 wherein said steps of determining if a received input compressed code is equal to a reserved code, fetching said reduced run count, recovering said run count, repeatedly providing the data character and outputting said recovered run comprises run processing, said LZW data decompression process includes an initial processing point at which a first compressed code is fetched, said method further including returning to said initial processing point after performing said run processing.

27. Data compression apparatus for compressing an input stream of data characters into an output stream of compressed codes, said apparatus including an LZW data compressor, said LZW data compressor including means for storing strings of data characters, a code counter for assigning respective codes to said stored strings and means for incrementing said code counter for each said stored string, said apparatus comprising:

means for detecting when a run of data characters is occurring in said input stream by detecting when a predetermined number of adjacent data characters of said input stream are the same with respect to each other, means for counting data characters in said detected run to provide a run count, means for providing a modified code by combining the existing code in said code counter with said run count, said LZW data compressor being operative to compress said input stream when a run is not occurring therein by comparing said input stream to said stored strings to determine longest matches therewith and providing said codes assigned thereto, thereby providing LZW compressed codes, and means for outputting said modified code and said LZW compressed codes so as to provide said output stream.

28. The apparatus of claim 27 wherein said means for providing comprises means for providing said modified code so that when said modified code is received by an LZW data decompressor, said run count may be recovered by combining the received modified code with the existing code in the code counter in said LZW data decompressor.

29. The apparatus of claim 28 wherein said means for providing a modified code comprises means for providing said modified code by adding said run count to said existing code in said code counter of said LZW data compressor.

30. The apparatus of claim 29 wherein said run count is recovered by subtracting said existing code in said code counter of said LZW data decompressor from said received modified code.

31. The apparatus of claim 27 wherein said means for outputting further comprises means for outputting the data character of said detected run prior to said modified code.

32. The apparatus of claim 27 wherein said means for detecting when a run of data characters is occurring, said means for counting data characters in said detected run, said means for providing a modified code and said means for outputting said modified code comprise means for performing run processing, said means for storing included in said LZW data compressor comprises means for storing extended strings, each comprising a longest match extended by the next following data character in said input stream, said means for performing being operative in performing said run processing after said LZW data compressor determines a longest match, stores the extended string corresponding thereto and provides the code assigned to said longest match.

33. The apparatus of claim 32 wherein said LZW data compressor is operative to determine said longest match by fetching said next following data character in said input stream thereby resulting in a mismatch with said stored strings, said fetched input data character being a mismatching character, said means for performing further comprises means for performing said run processing beginning with said mismatching character, and said means for detecting further comprises means for detecting when said run is occurring by detecting when said predetermined number of said adjacent data characters are the same as said mismatching character.

34. The apparatus of claim 33 wherein said means for outputting further comprises means for outputting the data character of said detected run prior to said modified code, said data character of said detected run comprising said mismatching character.

35. Data compression apparatus for compressing an input stream of data characters into an output stream of compressed codes, said apparatus including an LZW data compressor, said LZW data compressor including means for storing strings of data characters, a code counter for assigning respective codes to said stored strings and means for incrementing said code counter for each said stored string, said apparatus comprising:

means for detecting when a run of data characters is occurring in said input stream by detecting when a predetermined number of adjacent data characters of said input stream are the same with respect to each other, means for counting data characters in said detected run to provide a run count, means for providing a reduced count by reducing said run count to less than a predetermined number by using a selected predetermined process, means for providing a reserved code corresponding to said selected predetermined process, said LZW data compressor being operative to compress said input stream when a run is not occurring therein by comparing said input stream to said stored strings to determine longest matches therewith and providing said codes assigned thereto, thereby providing LZW compressed codes, and means for outputting said reserved code, said reduced count and said LZW compressed codes so as to provide said output stream.

36. The apparatus of claim 35 wherein said means for providing comprise means for providing said reserved code and said reduced count so that when said reserved code and said reduced count are received by an LZW data decompressor, said run count may be recovered by increasing said received reduced count by using the inverse of said selected predetermined process.

37. The apparatus of claim 36 wherein said selected predetermined process comprises subtracting a predetermined constant from said run count so as to reduce said run count to less than said predetermined number, said reserved code corresponding to said predetermined constant.

38. The apparatus of claim 37 wherein said run count is recovered by adding said predetermined constant corresponding to said received reserved code to said received reduced count.

39. The apparatus of claim 35 wherein said means for outputting comprises means for outputting the data character of said detected run prior to said reserved code.

40. The apparatus of claim 35 wherein said means for detecting when a run of data characters is occurring, said means for counting data characters in said detected run, said means for providing a reduced count, said means for providing a reserved code and said means for outputting said reserved code and said reduced count comprises means for performing run processing, said means for storing included in said LZW data compressor comprises means for storing extended strings, each comprising a longest match extended by the next following data character in said input stream, said means for performing being operative in performing said run processing after said LZW data compressor determines a longest match, stores the extended string corresponding thereto and provides the code assigned to said longest match.

41. The apparatus of claim 40 wherein said LZW data compressor is operative to determine said longest match by fetching said next following data character in said input stream thereby resulting in a mismatch with said stored strings, said fetched input data character being a mismatching character, said means for performing further comprises means for performing said run processing beginning with said mismatching character, and said means for detecting further comprises means for detecting when said run is occurring by detecting when said predetermined number of said adjacent data characters are the same as said mismatching character.

42. The apparatus of claim 41 wherein said means for outputting further comprises means for outputting the data character of said detected run prior to said reserved code, said data character of said detected run comprising said mismatching character.

43. Data decompression apparatus for decompressing an input stream of compressed codes to recover an output stream of data characters corresponding thereto, said apparatus including an LZW data decompressor, said LZW data decompressor including means for storing strings of data characters, a code counter for assigning respective codes to said stored strings and means for incrementing said code counter for each said stored string, said apparatus comprising:

means for comparing a received input compressed code to the existing code in said code counter to determine if said received input compressed code represents a run count, means for recovering said run count by combining said received input compressed code with said existing code in said code counter, means for repeatedly providing the data character represented by the compressed code received prior to said received input compressed code, said data character being repeatedly provided a number of times corresponding to said recovered run count, thereby providing a recovered run, said LZW data decompressor being operative to provide said stored strings corresponding to received compressed codes when said received compressed codes do not denote run counts, thereby providing LZW recovered strings, and means for outputting said recovered run and said LZW recovered strings so as to provide said output stream.

44. The apparatus of claim 43 wherein said means for comparing comprises means for comparing said received input compressed code to said existing code in said code counter to determine if said received input compressed code is greater than said existing code in said code counter, thereby determining that said received input compressed code represents a run count.

45. The apparatus of claim 43 wherein said means for recovering comprises means for recovering said run count by subtracting said existing code in said code counter from said received input compressed code, thereby providing said recovered run count.

46. The apparatus of claim 43 wherein said means for storing included in said LZW data decompressor comprises means for storing extended strings, said means for storing comprising means for storing an extended string that is extended by said data character represented by said prior received compressed code.

47. The apparatus of claim 43 wherein said means for comparing a received input compressed code, said means for recovering said run count, said means for repeatedly providing the data character and said means for outputting said recovered run comprises means for performing run processing, said LZW data decompressor being operative to include an initial processing point at which a first compressed code is fetched, said apparatus further including means for returning to said initial processing point after performing said run processing.

48. Data decompression apparatus for decompressing an input stream of compressed codes to recover an output stream of data characters corresponding thereto, said apparatus including an LZW data decompressor, said LZW data decompressor including means for storing strings of data characters, a code counter for assigning respective codes to said stored strings and means for incrementing said code counter for each said stored string, said apparatus comprising:

means for determining if a received input compressed code is equal to a reserved code, said reserved code denoting that a run count will follow that has been reduced by a selected predetermined process corresponding to said received reserved code, means for fetching said reduced run count, means for recovering said run count by increasing said fetched reduced run count by using the inverse of said selected predetermined process corresponding to said received reserved code, means for repeatedly providing the data character represented by the compressed code received prior to said received reserved code, said data character being repeatedly provided a number of times corresponding to said recovered run count, thereby providing a recovered run, said LZW data decompressor being operative to provide said stored strings corresponding to received compressed codes when said received compressed codes do not denote run counts, thereby providing LZW recovered strings, and means for outputting said recovered run and said LZW recovered strings so as to provide said output stream.

49. The apparatus of claim 48 wherein said selected predetermined process comprises subtracting a predetermined constant corresponding to said reserved code from said run count, thereby providing said reduced run count.

50. The apparatus of claim 49 wherein said means for recovering comprises means for recovering said run count by adding said predetermined constant corresponding to said received reserved code to said fetched reduced run count.

51. The apparatus of claim 48 wherein said means for storing included in said LZW data decompressor comprises means for storing extended strings, said means for storing comprising means for storing an extended string that is extended by said data character represented by said prior received compressed code.

52. The apparatus of claim 48 wherein said means for determining if a received input compressed code is equal to a reserved code, said means for fetching said reduced run count, said means for recovering said run count, said means for repeatedly providing the data character and said means for outputting said recovered run comprises means for performing run processing, said LZW data decompressor being operative to include an initial processing point at which a first compressed code is fetched, said apparatus further including means for returning to said initial processing point after performing said run processing.

* * * * *